US010096463B2

United States Patent
Hashimoto et al.

(10) Patent No.: US 10,096,463 B2
(45) Date of Patent: Oct. 9, 2018

(54) METHOD OF MANUFACTURING SEMICONDUCTOR DEVICE, SUBSTRATE PROCESSING APPARATUS COMPRISING EXHAUST PORT AND MULTIPLE NOZZLES, AND RECORDING MEDIUM

(71) Applicant: HITACHI KOKUSAI ELECTRIC INC., Tokyo (JP)

(72) Inventors: Yoshitomo Hashimoto, Toyama (JP); Tatsuru Matsuoka, Toyama (JP); Masaya Nagato, Toyama (JP); Ryota Horiike, Toyama (JP); Shintaro Kogura, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/700,947

(22) Filed: Sep. 11, 2017

(65) Prior Publication Data

US 2018/0076017 A1 Mar. 15, 2018

(30) Foreign Application Priority Data

Sep. 14, 2016 (JP) .................................. 2016-179183

(51) Int. Cl.
*H01L 21/02* (2006.01)
*C23C 16/44* (2006.01)
(Continued)

(52) U.S. Cl.
CPC ...... *H01L 21/0214* (2013.01); *C23C 16/4412* (2013.01); *C23C 16/45527* (2013.01);
(Continued)

(58) Field of Classification Search
CPC ............. H01L 21/0214; H01L 21/0228; H01L 21/02126; C23C 16/4412;
(Continued)

(56) References Cited

U.S. PATENT DOCUMENTS

2008/0050884 A1 2/2008 Koyanagi et al.
2008/0132069 A1* 6/2008 Lee ..................... C23C 16/405
438/680
(Continued)

FOREIGN PATENT DOCUMENTS

JP 2010-118462 A 5/2010
WO 2016/110956 A1 7/2016

OTHER PUBLICATIONS

Singaporean Examination Report dated Apr. 18, 2018 for the Singaporean Patent Application No. 10201707397Y.
Singaporean Search Report dated Apr. 18, 2018 for the Singaporean Patent Application No. 10201707397Y.

*Primary Examiner* — John P Dulka
(74) *Attorney, Agent, or Firm* — Volpe and Koenig, P.C.

(57) ABSTRACT

A method of manufacturing a semiconductor device includes: forming a film on a substrate by performing a cycle a predetermined number of times. The cycle includes non-simultaneously performing: supplying a precursor from a first nozzle to a substrate and exhausting the precursor from an exhaust port; supplying a first reactant from a second nozzle to the substrate and exhausting the first reactant from the exhaust port; and supplying a second reactant from a third nozzle to the substrate and exhausting the second reactant from the exhaust port. A substrate in-plane film thickness distribution of the film formed on the substrate is controlled by controlling a balance between a flow rate of an inert gas supplied from the second nozzle, a flow rate of an inert gas supplied from the third nozzle, and a flow rate of an inert gas supplied from the first nozzle in supplying the precursor.

15 Claims, 9 Drawing Sheets

(51) Int. Cl.
*C23C 16/455* (2006.01)
*C23C 16/52* (2006.01)
*H01L 21/673* (2006.01)
*H01L 21/677* (2006.01)

(52) U.S. Cl.
CPC .. *C23C 16/45553* (2013.01); *C23C 16/45563* (2013.01); *C23C 16/52* (2013.01); *H01L 21/0228* (2013.01); *H01L 21/02126* (2013.01); *H01L 21/67313* (2013.01); *H01L 21/67778* (2013.01)

(58) Field of Classification Search
CPC ............. C23C 16/45527; C23C 16/52; C23C 16/45553; C23C 16/45563
See application file for complete search history.

(56) References Cited

U.S. PATENT DOCUMENTS

| | | |
|---|---|---|
| 2009/0130858 A1* | 5/2009 | Levy .................... C23C 16/403 438/765 |
| 2009/0197424 A1 | 8/2009 | Sakai et al. |
| 2011/0186984 A1* | 8/2011 | Saito ................. H01L 21/02186 257/734 |
| 2012/0280369 A1* | 11/2012 | Saito .................... C23C 16/405 257/629 |
| 2013/0189854 A1 | 7/2013 | Hausmann et al. |
| 2013/0252435 A1* | 9/2013 | Shimamoto ....... H01L 21/02263 438/758 |
| 2015/0194302 A1* | 7/2015 | Akae ................. C23C 16/45525 438/770 |
| 2016/0024654 A1 | 1/2016 | Fukushima et al. |
| 2017/0103885 A1* | 4/2017 | Nakamura ............. C23C 16/02 |
| 2017/0298508 A1* | 10/2017 | Yamakoshi ....... H01L 21/67017 |

* cited by examiner

US 10,096,463 B2

METHOD OF MANUFACTURING SEMICONDUCTOR DEVICE, SUBSTRATE PROCESSING APPARATUS COMPRISING EXHAUST PORT AND MULTIPLE NOZZLES, AND RECORDING MEDIUM

CROSS-REFERENCE TO RELATED APPLICATION

This application is based upon and claims the benefit of priority from Japanese Patent Application No. 2016-179183, filed on Sep. 14, 2016, the entire contents of which are incorporated herein by reference.

TECHNICAL FIELD

The present disclosure relates to a method of manufacturing a semiconductor device, a substrate processing apparatus, and a non-transitory computer-readable recording medium.

BACKGROUND

One process of manufacturing a semiconductor device is a process of forming a film on a substrate.

SUMMARY

Some embodiments of the present disclosure provide a technique capable of controlling a substrate in-plane film thickness distribution of a film formed on a substrate.

According to one embodiment of the present disclosure, there is provided a technique including: forming a film on a substrate by performing a cycle a predetermined number of times, the cycle including non-simultaneously performing: supplying a precursor from a first nozzle to a substrate and exhausting the precursor from an exhaust port; supplying a first reactant from a second nozzle disposed at a position farther from the exhaust port than the first nozzle to the substrate and exhausting the first reactant from the exhaust port; and supplying a second reactant from a third nozzle disposed at a position closer to the exhaust port than the second nozzle to the substrate and exhausting the second reactant from the exhaust port, wherein a substrate in-plane film thickness distribution of the film formed on the substrate is controlled by controlling a balance between a flow rate of an inert gas supplied from the second nozzle, a flow rate of an inert gas supplied from the third nozzle, and a flow rate of an inert gas supplied from the first nozzle in supplying the precursor.

DETAILED DESCRIPTION

One Embodiment of the Present Disclosure

Figure 1:
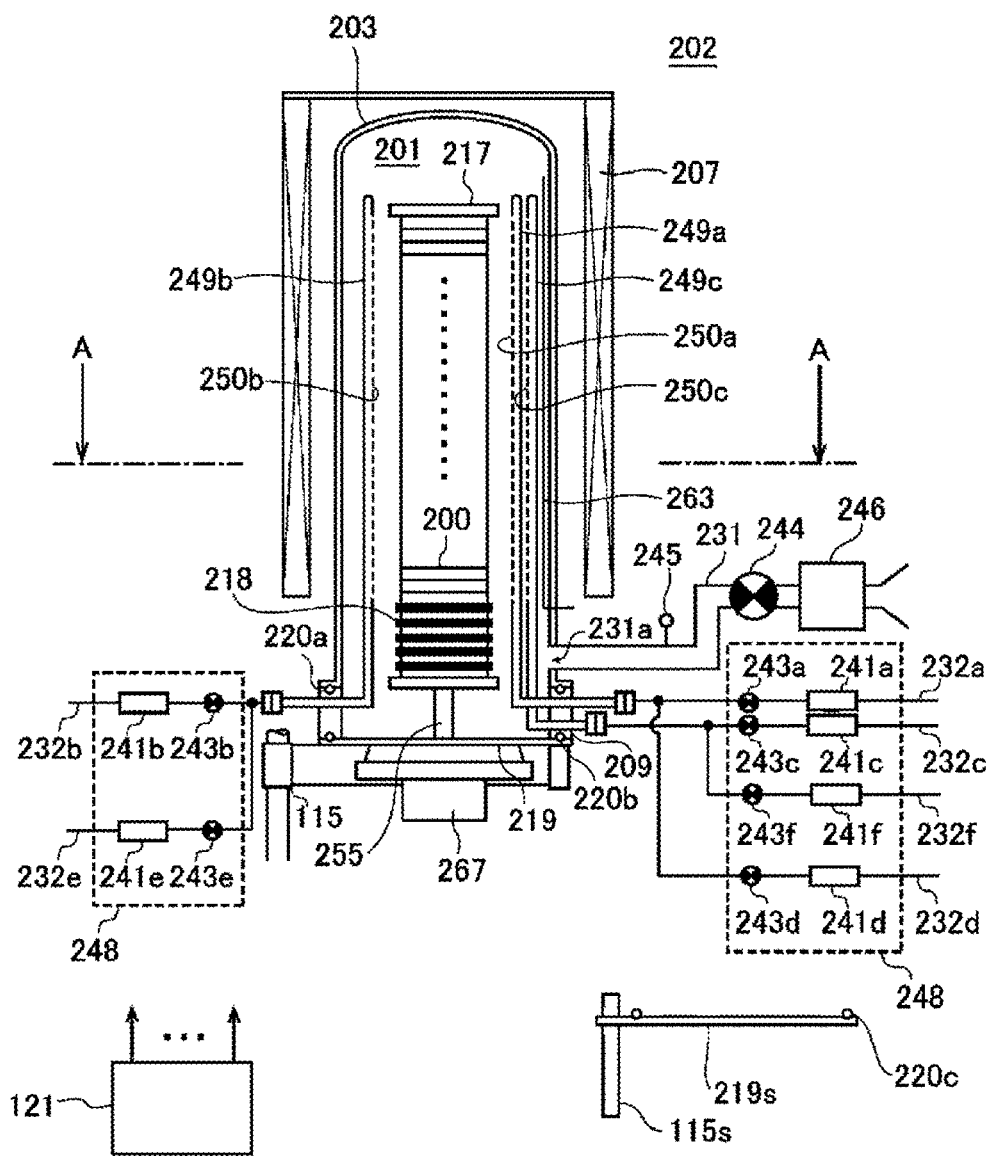
FIG. 1 is a schematic configuration diagram of a vertical type processing furnace of a substrate processing apparatus suitably used in one embodiment of the present disclosure, in which a portion of the processing furnace is shown in a vertical cross sectional view.

One embodiment of the present disclosure will be described as below with reference to FIGS. 1 to 3.
(1) Configuration of the Substrate Processing Apparatus As illustrated in FIG. 1, a processing furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A manifold 209 is disposed below the reaction tube 203 in a concentric relationship with the reaction tube 203. The manifold 209 is made of metal such as, e.g., stainless steel (SUS), and has a cylindrical shape with its upper and lower ends opened. An upper end portion of the manifold 209 engages with a lower end portion of the reaction tube 203 such that the manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) is mainly configured by the reaction tube 203 and the manifold 209. A process chamber 201 is defined in a hollow cylindrical portion of the processing vessel. The process chamber 201 is configured to accommodate a plurality of wafers 200 as substrates.

A nozzle 249a as a first nozzle, a nozzle 249b as a second nozzle, and a nozzle 249c as a third nozzle are installed inside the process chamber 201 so as to penetrate a sidewall of the manifold 209. Gas supply pipes 232a to 232c are respectively connected to the nozzles 249a to 249c.

Mass flow controllers (MFCs) 241a to 241c, which are flow rate controllers (flow rate control parts), and valves 243a to 243c, which are opening/closing valves, are installed in the gas supply pipes 232a to 232c sequentially from respective upstream sides, respectively. Gas supply pipes 232d to 232f, which supply an inert gas, are respectively connected to the gas supply pipes 232a to 232c at the downstream side of the valves 243a to 243c. MFCs 241d to 241*f* and valves 243*d* to 243*f* are respectively installed in the gas supply pipes 232*d* to 232*f* sequentially from the respective upstream sides.

Figure 2:
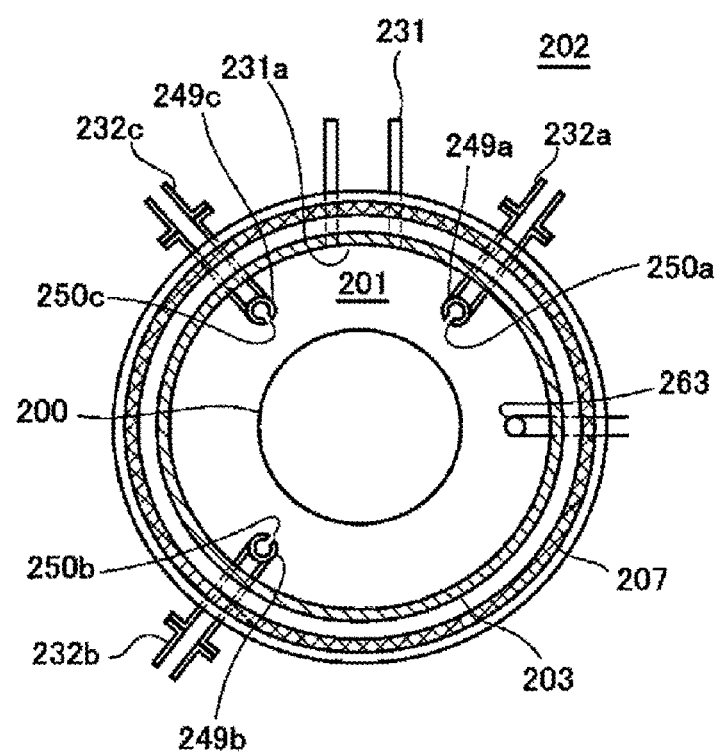
FIG. 2 is a schematic configuration diagram of the vertical type processing furnace of the substrate processing apparatus suitably used in one embodiment of the present disclosure, in which a portion of the processing furnace is shown in a cross sectional view taken along line A-A in FIG. 1.

As illustrated in FIG. 2, the nozzles 249*a* to 249*c* are respectively disposed in a space with an annular plan-view shape between the inner wall of the reaction tube 203 and the wafers 200 such that they extend upward along a stacking direction of the wafers 200 from a lower portion of the inner wall of the reaction tube 203 to an upper portion of the inner wall of the reaction tube 203. Specifically, the nozzles 249*a* to 249*c* are respectively installed at a lateral side of a wafer arrangement region in which the wafers 200 are arranged, namely in a region which horizontally surrounds the wafer arrangement region, so as to extend along the wafer arrangement region. That is to say, the nozzle 249*b* is disposed at a position farther from an exhaust port 231*a*, which will be described later, than the nozzle 249*a*, and the nozzle 249*c* is disposed at a position closer to the exhaust port 231*a* than the nozzle 249*b*. Furthermore, in the present embodiment, the nozzles 249*a* and 249*b* are disposed so as to face each other on a straight line with the centers of the wafers 200 carried into the process chamber 201 interposed therebetween. Gas supply holes 250*a* to 250*c* for supplying a gas are formed in the side surfaces of the nozzles 249*a* to 249*c*, respectively. The gas supply holes 250*a* to 250*c* are opened toward the center of the reaction tube 203 so as to allow a gas to be supplied toward the wafers 200. From these facts, the gas supply holes 250*a* and 250*b* are formed to face each other on a straight line with the centers of the wafers 200 interposed therebetween. A plurality of gas supply holes 250*a* to 250*c* may be formed between the lower portion of the reaction tube 203 and the upper portion of the reaction tube 203.

A precursor (precursor gas), for example, a halosilane-based gas containing silicon (Si) as a predetermined element (major element) and a halogen element, is supplied from the gas supply pipe 232*a* into the process chamber 201 via the MFC 241*a*, the valve 243*a* and the nozzle 249*a*. The precursor gas refers to a gaseous precursor, for example, a gas obtained by vaporizing a precursor which remains in a liquid state under room temperature and atmospheric pressure, or a precursor which remains in a gas state under room temperature and atmospheric pressure. The halosilane is silane having a halogen group. The halogen group includes a chloro group, a fluoro group, a bromo group, an iodine group, and the like. That is to say, the halogen group contains a halogen element such as chlorine (Cl), fluorine (F), bromine (Br), and iodine (I) or the like. As the halosilane-based gas, it may be possible to use, for example, a precursor gas containing Si and Cl, namely a chlorosilane-based gas. The chlorosilane-based gas acts as an Si source. As the chlorosilane-based gas, it may be possible to use, for example, a hexachlorodisilane ($Si_2Cl_6$, abbreviation: HCDS) gas.

A first reactor (reactant) having a chemical structure (molecular structure) different from that of the precursor, for example, an amine-based gas containing C and N, is supplied from the gas supply pipe 232*b* into the process chamber 201 via the MFC 241*b*, the valve 143*b* and the nozzle 249*b*. The amine-based gas acts as a C source and also acts as an N source. As the amine-based gas, it may be possible to use, for example, a triethylamine ($(C_2H_5)_3N$, abbreviation: TEA) gas.

A second reactor (reactant) having a chemical structure (molecular structure) different from that of the precursor, for example, an O-containing gas, is supplied from the gas supply pipe 232*c* into the process chamber 201 via the MFC 241*c*, the valve 143*c* and the nozzle 249*c*. The O-containing gas acts as an oxide gas, i.e., an O source. As the O-containing gas, it may be possible to use, for example, an oxygen ($O_2$) gas.

An inert gas, for example, a nitrogen ($N_2$) gas, is supplied from the gas supply pipes 232*d* to 232*f* into the process chamber 201 via the MFCs 241*d* to 241*f*, the valves 243*d* to 243*f*, the gas supply pipes 232*a* to 232*c*, and the nozzles 249*a* to 249*c*, respectively. The $N_2$ gas acts as a purge gas or a carrier gas, and also acts as a film thickness distribution control gas for controlling an in-plane film thickness distribution of a film formed on the wafer 200.

A precursor supply system is mainly configured by the gas supply pipe 232*a*, the MFC 241*a*, and the valve 243*a*. A first reactant supply system is mainly configured by the gas supply pipe 232*b*, the MFC 241*b*, and the valve 143*b*. A second reactant supply system is mainly configured by the gas supply pipe 232*c*, the MFC 241*c*, and the valve 143*c*. An inert gas supply system is mainly configured by the gas supply pipes 232*d* to 232*f*, the MFCs 241*d* to 241*f*, and the valves 243*d* to 243*f*.

Any one or all of various kinds of supply systems mentioned above may be configured as an integrated supply system 248 in which the valves 243*a* to 243*f*, the MFCs 241*a* to 241*f*, and the like are integrated. The integrated supply system 248 is connected to each of the gas supply pipes 232*a* to 232*f*, and is configured such that the supply operation of various kinds of gases into the gas supply pipes 232*a* to 232*f*, namely the opening/closing operation of the valves 243*a* to 243*f*, the flow rate adjusting operation of various kinds of gases by the MFCs 241*a* to 241*f*, and the like, are controlled by a controller 121 which will be described later. The integrated supply system 248 is configured as an integral type or division type integrated unit, and can be detachable from the gas supply pipes 232*a* to 232*f* and the like on an integrated unit basis, thereby performing the maintenance, replacement, expansion, and the like of the integrated supply system 248 on an integrated unit basis.

An exhaust port 321*a* configured to exhaust the internal atmosphere of the process chamber 201 is formed below a sidewall of the reaction tube 203. An exhaust pipe 231 is connected to the exhaust port 231*a*. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure adjustment part). The APC valve 244 is a valve configured so that the vacuum exhaust of the interior of the process chamber 201 and the stop of the vacuum exhaust can be performed by opening and closing the APC valve 244 while operating the vacuum pump 246. Further, the APC valve 244 is a valve configured so that the internal pressure of the process chamber 201 can be adjusted by adjusting the opening degree of the APC valve 244 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is made of metal such as, e.g., stainless steel or the like, and is formed in a disc shape. An O-ring 220*b*, which is a seal member making contact with the lower end of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which transfers the boat 217, i.e., the wafers 200, into and out of the process chamber 201 by moving the seal cap 219 up and down. Furthermore, a shutter 219s as a furnace opening cover capable of hermetically sealing the lower end opening of the manifold 209 while moving the seal cap 219 down with the boat elevator 115 is installed under the manifold 209. The shutter 219s is made of metal such as, e.g., stainless steel or the like, and is formed in a disc shape. An O-ring 220c as a seal member making contact with the lower end of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate holder is configured to support the plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as, e.g., quartz or SiC. Heat insulating plates 218 made of a heat resistant material such as, e.g., quartz or SiC are installed below the boat 217 in multiple stages.

A temperature sensor 263 serving as a temperature detector is installed inside the reaction tube 203. Based on the temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
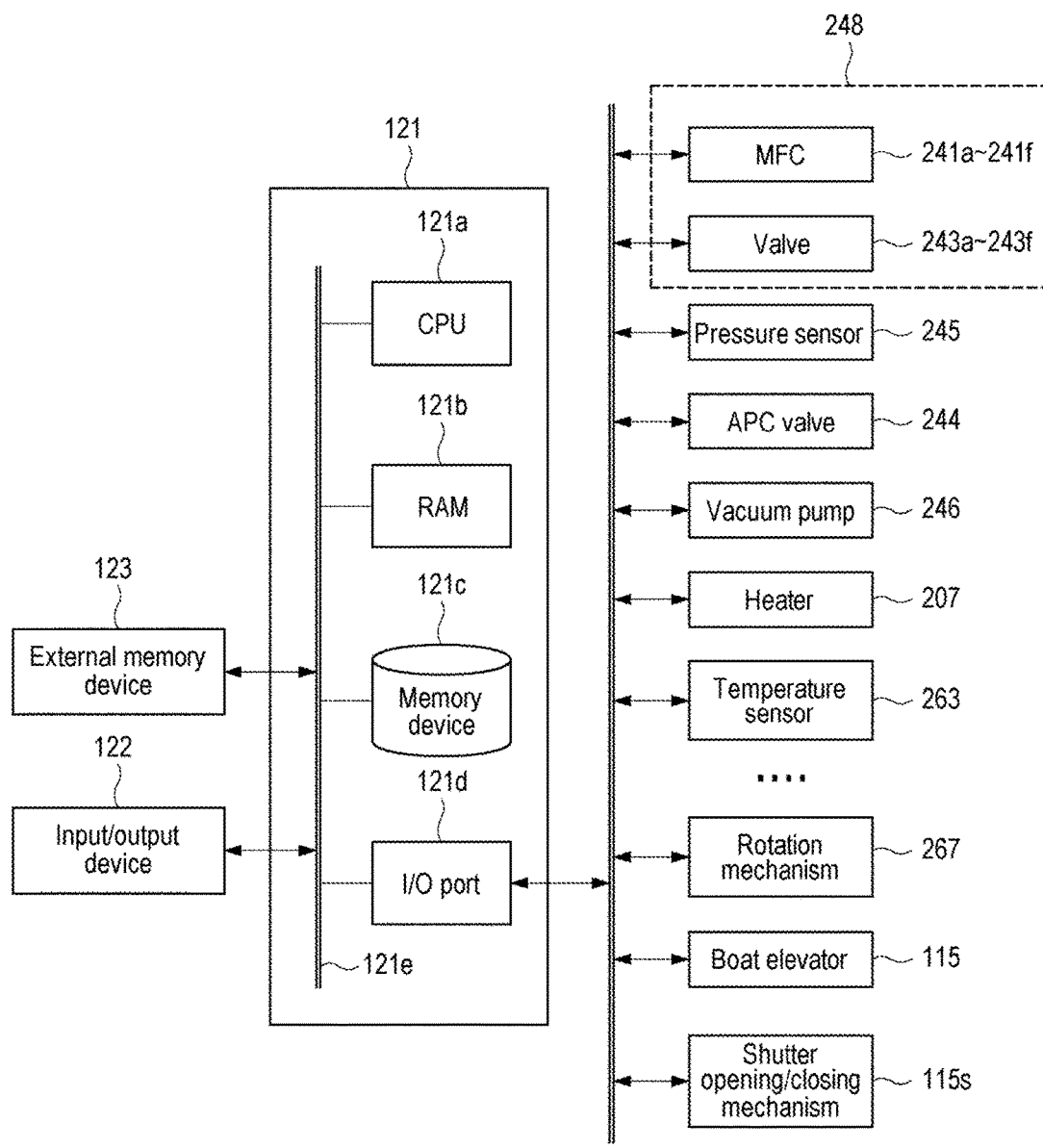
FIG. 3 is a schematic configuration diagram of a controller of the substrate processing apparatus suitably used in one embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a, via an internal bus 121e. An input/output device 122 formed of, e.g., a touch panel or the like, is connected to the controller 121.

The memory device 121c, is configured by, for example, a flash memory, a hard disk drive (HDD), or the like. A control program for controlling operations of a substrate processing apparatus, a process recipe for specifying sequences and conditions of a film forming process as described hereinbelow, or the like is readably stored in the memory device 121c. The process recipe functions as a program for causing the controller 121 to execute each sequence in the film forming process, as described hereinbelow, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as mentioned above.

The CPU 121a, is configured to read the control program from the memory device 121c, and execute the same. The CPU 121a, also reads the recipe from the memory device 121c, according to an operation command inputted from the input/output device 122. In addition, the CPU 121a, is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic disk such as a hard disk, an optical disc such as a CD, a magneto-optical disc such as an MO, or a semiconductor memory such as a USB memory). The memory device 121c, or the external memory device 123 is configured as a non-transitory computer-readable recording medium. Hereinafter, the memory device 121c, and the external memory device 123 will be generally and simply referred to as a "recording medium." When the term "recording medium" is used herein, it may indicate a case of including only the memory device 121c, a case of including only the external memory device 123, or a case of including both the memory device 121c, and the external memory device 123. Furthermore, the program may be supplied to the computer using a communication means such as the Internet or a dedicated line, instead of using the external memory device 123.

(2) Film Forming Process

A sequence example of forming a film on a wafer 200 as a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

Figure 4:
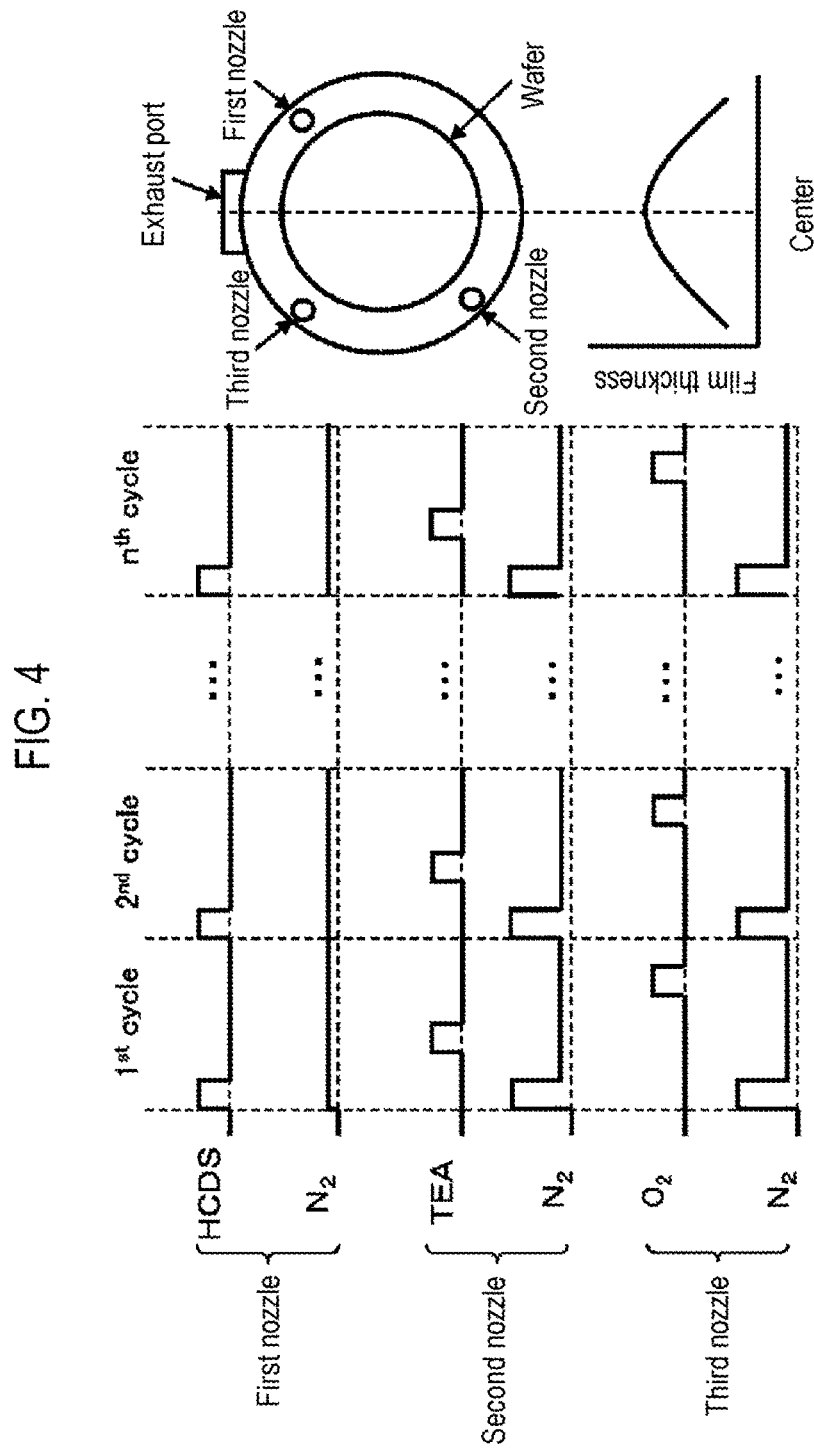
FIG. 4 is a diagram illustrating a film forming sequence according to one embodiment of the present disclosure.

In the film forming sequence illustrated in FIG. 4, a film containing Si, O, C and N, namely a silicon oxycarbonitride film (SiOCN film) is formed on a wafer 200 by performing a cycle a predetermined number of times, the cycle including non-simultaneously performing: a step 1 of supplying an HCDS gas from the nozzle 249a to the wafer 200 and exhausting the HCDS gas from the exhaust port 231a; a step 2 of supplying a TEA gas from the nozzle 249b disposed at a position farther from the exhaust port 231a than the nozzle 249a to the wafer 200 and exhausting the TEA gas from the exhaust port 321a; and a step 3 of supplying an $O_2$ gas from the nozzle 249c disposed at a position closer to the exhaust port 231a than the nozzle 249b to the wafer 200 and exhausting the O₂ gas from the exhaust port 231a.

Furthermore, in the film forming sequence illustrated in FIG. 4, a wafer in-plane film thickness distribution of the SiOCN film formed on the wafer 200 (hereinafter, also referred to simply as a "in-plane film thickness distribution") is controlled by controlling a balance between the flow rate of the N₂ gas supplied from the nozzle 249b, the flow rate of the N₂ gas supplied from the nozzle 249c, and the flow rate of the N₂ gas supplied from the nozzle 249a when the HCDS gas is supplied.

As an example of one embodiment, the following is a description of the in-plane film thickness distribution of the SiOCN film (hereinafter, referred to as a "centrally convex distribution") as illustrated in FIG. 4 in which the SiOCN film is thickest at a central portion of the wafer 200 and is gradually reduced in thickness toward a peripheral portion of the wafer 200 which is achieved by setting the flow rate of the N₂ gas supplied from the nozzle 249b to become greater than that of the N₂ gas supplied from the nozzle 249a when the HCDS gas is supplied. In addition, if a film having a centrally convex distribution can be formed on a bare wafer having a small surface area without an irregular structure on its surface, a film having a flat film thickness distribution (hereinafter, referred to as a "flat distribution") with a small film thickness variation from the center toward the periphery can be formed on a pattern wafer having a large surface area with a fine irregular structure on its surface.

In the present disclosure, for the sake of convenience, the film forming sequence illustrated in FIG. 4 may sometimes be denoted as follows. The same denotation will be used in modifications as described hereinbelow.

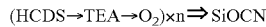

(HCDS→TEA→O₂)×n ⇒ SiOCN

Furthermore, in the case of performing the film forming sequence illustrated in FIG. 4, an N-free film containing Si, O and C, namely a silicon oxycarbide film (SiOC film), may be formed on the wafer 200 according to process conditions. Hereinafter, an example in which a bare wafer is used as the wafer 200 and an SiOCN film is formed on the bare wafer will be described, but the present disclosure is not limited to this example.

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to "a surface of a wafer itself" or "a surface of a predetermined layer formed on a wafer". Furthermore, in the present disclosure, the expression "a predetermined layer is formed on a wafer" may mean that "a predetermined layer is directly formed on a surface of a wafer itself" or that "a predetermined layer is formed on a layer formed on a wafer". In addition, when the term "substrate" is used herein, it may be synonymous with the term "wafer."

(Wafer Charging and Boat Loading)

A plurality of wafers 200 is charged in the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely the space in which the wafers 200 are located, is vacuum-exhausted (depressurization-exhausted) by the vacuum pump 246 so as to reach a desired pressure (degree of vacuum). In this operation, an internal pressure of the process chamber 201 is measured by the pressure sensor 245. The APC valve 244 is feedback-controlled based on the measured pressure information. Furthermore, the interior of the process chamber 201 is heated by the heater 207 such that the wafers 200 inside the process chamber 201 reach a desired process temperature. In this operation, the state of supplying electric power to the heater 207 is feedback-controlled based on the temperature information detected by the temperature sensor 263 such that the interior of the process chamber 201 has a desired temperature distribution. Subsequently, the rotation of the wafers 200 by the rotation mechanism 267 begins. The exhaust and heating of the interior of the process chamber 201 and the rotation of the wafers 200 may all be continuously performed at least until the process of the wafers 200 is completed.

(Film Forming Step)

Next, the following steps 1 to 3 are sequentially performed.

[Step 1]

At this step, an HCDS gas is supplied to the wafer 200 within the process chamber 201 and is exhausted from the exhaust port 231a.

Specifically, the valve 243a is opened to allow the HCDS gas to flow through the gas supply pipe 232a. The flow rate of the HCDS gas is adjusted by the MFC 241a. The HCDS gas is supplied into the process chamber 201 via the nozzle 249a and is exhausted from the exhaust port 231a. At this time, the HCDS gas is supplied to the wafer 200. Simultaneously, the valves 243d to 243f are opened to allow an N₂ gas to flow through the gas supply pipes 232d to 232f. The flow rate of the N₂ gas is adjusted by the MFCs 241d to 241f. The N₂ gas is supplied into the process chamber 201 via the nozzles 249a to 249c and is exhausted from the exhaust port 231a.

At this time, the supply flow rate of the HCDS gas supplied from the nozzle 249a may be set at a predetermined flow rate which falls within a range of, for example, 1 to 2,000 sccm, specifically 10 to 1,000 sccm. The supply flow rate of the N₂ gas supplied from the nozzle 249a may be set at a predetermined flow rate which falls within a range of, for example, 500 to 2,000 sccm. The supply time period of the HCDS gas may be set at a predetermined time period which falls within a range of, for example, 1 to 120 seconds, specifically 1 to 60 seconds. The internal pressure of the process chamber 201 may be set at a predetermined pressure which falls within a range of, for example, 1 to 2,666 Pa, specifically 67 to 1,333 Pa. The temperature (film-forming temperature) of the wafer 200 may be set at a predetermined temperature which falls within a range of, for example, 250 to 800 degrees C., specifically 400 to 750 degrees C., more specifically 550 to 700 degrees C.

If the film-forming temperature is lower than 250 degrees C., a practical deposition rate may not be obtained because HCDS is hardly chemisorbed onto the wafer 200. This may be solved by setting the film-forming temperature to become 250 degrees C. or higher. By setting the film-forming temperature to become 400 degrees C. or higher, further 550 degrees C. or higher, it is possible to more sufficiently adsorb HCDS onto the wafer 200 and to obtain a more sufficient deposition rate.

If the film-forming temperature exceeds 800 degrees C., an excessive gas phase reaction may occur. Thus, the film thickness uniformity is likely to deteriorate and controlling the film thickness uniformity becomes difficult. By setting the film-forming temperature at 800 degrees C. or lower, a moderate gas phase reaction can occur to limit deterioration in the film thickness uniformity and to control the film thickness uniformity. In particular, by setting the film-forming temperature at 750 degrees C. or lower, further 700 degrees C. or lower, the surface reaction becomes dominant over the gas phase reaction. This makes it easy to ensure the film thickness uniformity and to control the film thickness uniformity.

By supplying the HCDS gas to the wafer 200 under the aforementioned conditions, an Si-containing layer containing Cl and having a thickness of, e.g., about less than one atomic layer to several atomic layers (less than one molecular layer to several molecular layers) as a first layer (initial layer) is formed on the uppermost surface of the wafer 200. The Si-containing layer containing Cl may include an Si layer containing Cl, an adsorption layer of HCDS, or both.

The Cl-containing Si layer generally refers to layers including a Cl-containing continuous layer formed of Si, a Cl-containing discontinuous layer formed of Si, and a Cl-containing Si thin film formed by laminating the continuous layer and the discontinuous layer. Si constituting the Cl-containing Si layer includes Si whose bond to Cl is completely broken, in addition to Si whose bond to Cl is not completely broken.

The adsorption layer of HCDS includes not only a continuous adsorption layer of HCDS molecules but also a discontinuous adsorption layer of HCDS molecules. The HCDS molecules constituting the adsorption layer of HCDS include ones in which some of the Si—Cl bonds are broken. That is to say, the adsorption layer of HCDS may include a physisorption layer of HCDS, a chemisorption layer of HCDS, or both.

Here, the layer having a thickness of less than one atomic layer (molecular layer) refers to an atomic layer (molecular layer) which is discontinuously formed, and the layer having a thickness equal to one atomic layer (molecular layer) refers to an atomic layer (molecular layer) which is continuously formed. The Si-containing layer containing Cl may include both the Cl-containing Si layer and the adsorption layer of HCDS. However, for the sake of convenience, the Si-containing layer containing Cl will be represented by the expression of "one atomic layer," "several atomic layers" or the like and the "atomic layer" may be synonymous with the "molecular layer".

Under a condition in which the HCDS gas is autolyzed (pyrolyzed), Si is deposited on the wafer 200 to form a Cl-containing Si layer. Under a condition in which the HCDS gas is not autolyzed (not pyrolyzed), HCDS is adsorbed onto the wafer 200 to form an adsorption layer of HCDS. From the viewpoint of enhancing the deposition rate, forming the Cl-containing Si layer on the wafer 200 is more desirable than forming the adsorption layer of HCDS on the wafer 200. Hereinafter, the Si-containing layer containing Cl will also be referred to simply as an Si-containing layer, for the sake of convenience.

If the thickness of the first layer exceeds several atomic layers, a modification action at steps 2 and 3 as described hereinbelow does not reach the entire first layer. In addition, a minimum value of the thickness of the first layer is less than one atomic layer. Thus, it is desirable that the thickness of the first layer is about less than one atomic layer to several atomic layers. By setting the thickness of the first layer at one atomic layer or less, namely one atomic layer or less than one atomic layer, it is possible to relatively enhance the modification action at steps 2 and 3 as described hereinbelow, and to shorten the time required for the modification action at steps 2 and 3. It is also possible to shorten the time required in forming the first layer at step 1. As a result, it is possible to shorten the process time per one cycle and to shorten the total process time. That is to say, it is also possible to increase the deposition rate. Moreover, by setting the thickness of the first layer at one atomic layer or less, it is possible to enhance the controllability of the film thickness uniformity.

In addition, in the present embodiment, the flow rate of the $N_2$ gas supplied from the nozzle 249b may set greater than the flow rate of the $N_2$ gas supplied from the nozzle 249a when the HCDS gas is supplied.

By balancing the flow rates of the $N_2$ gas supplied from the nozzles 249b and 249a in this way, it is possible to set the pressure of a space with an annular plan-view shape (hereinafter, simply referred to as "annular space") between the inner wall of the reaction tube 203 and the wafer 200 to become greater than the internal pressure of the wafer arrangement region, namely the pressure of the space between the wafers 200. As a result, it is possible to limit leakage of the HCDS gas to the annular space and to promote the supply of the HCDS gas to the space between the wafers 200, thus increasing the supply amount of the HCDS gas to the central portion of the wafer 200. It is also possible to lower the partial pressure (concentration) of HCDS gas in the annular space and to reduce the supply amount of HCDS gas to the peripheral portion of the wafer 200. As a result, the thickness distribution of the first layer in the plane of the wafer 200, and the in-plane film thickness distribution of the SiOCN film formed on the wafer 200 can have the aforementioned centrally convex distribution. Hereinafter, this film thickness distribution control will also be referred to as a centrally convex distribution control.

Moreover, this effect can be enhanced as the flow rate of the $N_2$ gas supplied from the nozzle 249b is increased. For example, it is possible to reliably realize the aforementioned centrally convex distribution by setting the flow rate of the $N_2$ gas supplied from the nozzle 249b to become greater than the sum of the flow rate of the HCDS gas and the flow rate of the $N_2$ gas which are supplied from the nozzle 249a. In addition, this effect can be enhanced as the position of the nozzle 249b is more distant from the position of the exhaust port 231a and can be maximized when the nozzle 249b and the exhaust port 231a face each other on a straight line with the center of the wafer 200 interposed therebetween. Furthermore, this effect can be effectively achieved as the position of the nozzle 249b is more distant from the position of the nozzle 249a, and more effectively achieved when the nozzle 249b is disposed at a position facing the nozzle 249a with the center of the wafer 200 interposed therebetween, for example, as illustrated in FIG. 2.

In the film forming sequence illustrated in FIG. 4, the $N_2$ gas whose flow rate is greater than that of the $N_2$ gas supplied from the nozzle 249a is supplied also from the nozzle 249c, as well as from the nozzle 249b, when the HCDS gas is supplied. Thus, it is possible to further increase the pressure of the aforementioned annular space. Furthermore, by supplying a large flow rate of $N_2$ gas from a plurality of different locations in the circumferential direction using the plurality of nozzles, it is possible to increase the pressure of the aforementioned annular space more evenly in the circumferential direction. As a result, the aforementioned centrally convex distribution may be more easily realized. FIG. 4 illustrates an example in which the flow rate of the $N_2$ gas supplied from the nozzle 249b and the flow rate of $N_2$ gas supplied from the nozzle 249c are equal to each other.

However, as described above, the nozzle 249c is disposed at a position closer to the exhaust port 231a than the nozzle 249b. The $N_2$ gas supplied from the nozzle 249c stays for a shorter time within the process chamber 201 than the $N_2$ gas supplied from the nozzle 249b, and is mostly exhausted from the exhaust port 231a within a short time. It may be said that, compared with the $N_2$ gas supplied from the nozzle 249b, the $N_2$ gas supplied from the nozzle 249c has weak influence over the in-plane film thickness distribution of the film formed on the wafer 200. In other words, when the flow rate of the $N_2$ gas supplied from the nozzle 249b is equal to or greater than the flow rate of the $N_2$ gas supplied from the nozzle 249c, it is also possible to more effectively realize the aforementioned centrally convex distribution control, compared with the case where the magnitude relationship between these flow rates is reversed. By adjusting the flow rate of the $N_2$ gas supplied from the nozzle 249b to become equal to or greater than the flow rate of the $N_2$ gas supplied from the nozzle 249c, it is possible to realize the same centrally convex distribution control at low $N_2$ gas consumption and at low cost. It is considered that it is theoretically possible to realize the aforementioned centrally convex distribution control by not supplying the $N_2$ gas from the nozzle 249b and setting the flow rate of the $N_2$ gas supplied from the nozzle 249c at a very large flow rate when the HCDS gas is supplied. However, considering that the $N_2$ gas supplied from the nozzle 249c is mostly exhausted from the exhaust port 231a soon after contributing to the aforementioned in-plane film thickness distribution control, it may be said that increasing the degree of the centrally convex distribution in this alternative method (i.e., increasing the difference in film thickness between the central portion and the peripheral portion) is very expensive, relative to the method of the present embodiment, and is not practical.

In a case where the balance of the flow rate of the $N_2$ gas is set as in the present embodiment, the flow rate of the $N_2$ gas supplied from the nozzle 249b when HCDS is supplied becomes greater than the flow rate of the $N_2$ gas supplied from the nozzle 249b when HCDS is not supplied. For example, the flow rate of the $N_2$ gas supplied from the nozzle 249b when HCDS is supplied becomes greater than the flow rate of the $N_2$ gas supplied from the nozzle 249b when the TEA gas is supplied at step 2 and also greater than the flow rate of the $N_2$ gas supplied from the nozzle 249b when the $O_2$ gas is supplied at step 3. Furthermore, as will be described hereinbelow, at each of steps 1 to 3, a purge step of exhausting the HCDS gas, the TEA gas, and the $O_2$ gas from the interior of the process chamber 201 and supplying the $N_2$ gas as a purge gas into the process chamber 201 is performed. In a case where the balance of the flow rate of the $N_2$ gas is set as described above, the flow rate of the $N_2$ gas supplied from the nozzle 249b when HCDS is supplied becomes greater than the flow rate of the $N_2$ gas, i.e., the $N_2$ gas as a purge gas, supplied from the nozzle 249b when the interior of the process chamber 201 is purged.

The flow rates of the $N_2$ gas supplied from the nozzles 249b and 249c may be set to meet the aforementioned flow rate balance and may be respectively set at a predetermined flow rate which falls within a range of, for example, 3,000 to 6,000 sccm.

After the first layer is formed, the valve 243a is closed to stop the supply of the HCDS gas. At this time, the interior of the process chamber 201 is vacuum-exhausted by the vacuum pump 246 with the APC valve 244 opened. Thus, the unreacted HCDS gas which is the remaining gas after the formation of the first layer in the process chamber 201, is removed from the interior of the process chamber 201. At this time, the $N_2$ gas as a purge gas is supplied into the process chamber 201 while opening the valves 243d to 243f (purge step). The supply flow rate of the $N_2$ gas supplied from each gas supply pipe may be set at a flow rate which falls within a range of, for example, 500 to 2,000 sccm.

[Step 2]

After step 1 is completed, a TEA gas is supplied to the wafer 200 within the process chamber 201, namely to the first layer formed on the wafer 200, and is exhausted from the exhaust port 231a.

In this step, the opening/closing control of the valves 143b, and 243d to 243f is performed using the same procedure as the opening/closing control of the valves 243a, and 243d to 243f in step 1. The flow rate of the TEA gas is adjusted by the MFC 241b. The TEA gas is supplied into the process chamber 201 via the nozzle 249b and is exhausted from the exhaust pipe 231. At this time, the TEA gas is supplied to the wafer 200.

The supply flow rate of the TEA gas may be set at a predetermined flow rate which falls within a range of, for example, 200 to 10,000 sccm. The supply time period of the TEA gas may be set at a predetermined time period which falls within a range of, for example, 1 to 120 seconds, specifically 1 to 60 seconds. The supply flow rate of the $N_2$ gas supplied from each gas supply pipe may be set at a predetermined flow rate which falls within a range of, for example, 500 to 2,000 sccm. The internal pressure of the process chamber 201 may be set at a predetermined pressure which falls within a range of, for example, 1 to 5,000 Pa, specifically 1 to 4,000 Pa. By setting the internal pressure of the process chamber 201 within a relatively high pressure range, it is possible to thermally activate the TEA gas in a non-plasma state. The supply of the TEA gas which has been thermally activated can cause a relatively soft reaction to facilitate the formation of a second layer which will be described later. Other process conditions may be similar to those of step 1.

By supplying the TEA gas to the wafer 200 under the aforementioned conditions, the first layer formed on the wafer 200 at step 1 and the TEA gas may react with each other. Thus, at least some of a plurality of Cl atoms contained in the first layer can be drawn out (separated) from the first layer and at least some of a plurality of ethyl groups contained in the TEA gas can be separated from the TEA gas. Then, N of the TEA gas from which at least some ethyl groups were separated and Si contained in the first layer can be bonded to form an Si—N bond. Furthermore, C contained in the ethyl groups separated from the TEA gas and Si contained in the first layer can also be bonded to form an Si—C bond. As a result, Cl is desorbed from the first layer and the C component and the N component are newly introduced into the first layer. In this manner, the first layer is modified to form a layer containing Si, C, and N, i.e., a silicon carbonitride layer (SiCN layer), as the second layer, on the wafer 200.

When the second layer is formed, Cl contained in the first layer or H contained in the TEA gas constitutes a gaseous substance containing at least any one of Cl and H during the process of modifying the first layer by the TEA gas and is discharged from the interior of the process chamber 201 through the exhaust pipe 231. That is to say, an impurity such as Cl of the first layer is drawn out or desorbed from the first layer so as to be separated from the first layer. Thus, the second layer becomes a layer having an impurity such as Cl, but in amounts less than the first layer.

After the second layer is formed, the valve 243b is closed to stop the supply of the TEA gas. Then, the unreacted TEA gas which is the remaining gas after the formation of the second layer or the reaction byproduct in the process chamber 201, is removed from the interior of the process chamber 201 under the same process procedures and the process conditions as those of the purge step of step 1.

[Step 3]

After step 2 is completed, an $O_2$ gas is supplied to the wafer 200 within the process chamber 201, namely to the second layer formed on the wafer 200, and is exhausted from the exhaust port 231a.

At this step, the opening/closing control of the valves 243c, and 243d to 243f is performed using the same procedure as the opening/closing control of the valves 243a, and 243d to 243f at step 1. The flow rate of the $O_2$ gas is adjusted by the MFC 241c. The $O_2$ gas is supplied into the process chamber 201 via the nozzle 249c and is exhausted from the exhaust pipe 231. At this time, the $O_2$ gas is supplied to the wafer 200.

The supply flow rate of the $O_2$ gas may be set at a predetermined flow rate which falls within a range of, for example, 100 to 10,000 sccm. The supply time period of the $O_2$ gas may be set at a predetermined time period which falls within a range of, for example, 1 to 120 seconds, specifically 1 to 60 seconds. The supply flow rate of the $N_2$ gas supplied from each gas supply pipe may be set at a predetermined flow rate which falls within a range of, for example, 500 to 2,000 sccm. The internal pressure of the process chamber 201 may be set at a predetermined pressure which falls within a range of, for example, 1 to 4,000 Pa, specifically 1 to 3,000 Pa. By setting the internal pressure of the process chamber 201 within a relatively high pressure range, it is possible to thermally activate the $O_2$ gas in a non-plasma state. The supply of the $O_2$ gas which has been thermally activated can cause a relatively soft reaction to facilitate the formation of a third layer which will be described later. Other process conditions may be similar to, for example, those of step 1.

By supplying the $O_2$ gas to the wafer 200 under the aforementioned conditions, at least a portion of the second layer may be modified (oxidized). That is to say, at least a portion of the O component contained in the $O_2$ gas can be added to the second layer to form an Si—O bond in the second layer. The second layer is modified to form a layer containing Si, O, C and N, i.e., a silicon oxycarbonitride layer (SiOCN layer), as the third layer, on the wafer 200. When the third layer is formed, at least a portion of the C component or the N component contained in the second layer is kept in the second layer without desorbing from the second layer.

When the third layer is formed, Cl contained in the second layer constitutes a gaseous substance containing at least Cl during the modification process by the $O_2$ gas and is discharged from the interior of the process chamber 201. That is to say, an impurity such as Cl in the second layer is drawn out or desorbed from the interior of the second layer so as to be separated from the second layer. Thus, the third layer becomes a layer having an impurity such as Cl less than the second layer.

After the third layer is formed, the valve 243c is closed to stop the supply of the $O_2$ gas. Then, the unreacted $O_2$ gas, which is the remaining gas after the formation of the third layer or the reaction byproduct in the process chamber 201, is removed from the interior of the process chamber 201 under the same process procedures and conditions of the purge step of step 1.

(Performing a Predetermined Number of Times)

A cycle which non-simultaneously, i.e., non-synchronously, performs steps 1 to 3 is implemented one or more times (n times). Thus, an SiOCN film having a predetermined composition and a predetermined thickness can be formed on the wafer 200. The aforementioned cycle may be repeated multiple times. That is to say, the thickness of the third layer formed per one cycle may be set to be smaller than a desired thickness and the aforementioned cycle may be repeated multiple times until the thickness of the SiOCN film formed by laminating the third layer becomes equal to the desired thickness.

As the precursor, it may be possible to use, in addition to the HCDS gas, a chlorosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas or the like.

As the first reactant, it may be possible to use, in addition to the TEA gas, for example, an ethylamine-based gas such as a diethylamine (($C_2H_5)_2NH$, abbreviation: DEA) gas, a monoethylamine ($C_2H_5NH_2$, abbreviation: MEA) gas or the like, or a methylamine-based gas such as a trimethylamine (($CH_3)_3N$, abbreviation: TMeA) gas, a dimethylamine (($CH_3)_2NH$, abbreviation: DMeA) gas, a monomethylamine ($CH_3NH_2$, abbreviation: MMeA) gas or the like. Furthermore, as the first reactant, it may be possible to use an organic hydrazine-based gas such as a trimethylhydrazine (($CH_3)_2N_2(CH_3)H$, abbreviation: TMH) gas or the like.

As the second reactant, it may be possible to use, in addition to the $O_2$ gas, an O-containing gas such as water vapor ($H_2O$ gas), a nitrogen monoxide (NO) gas, a nitrous oxide ($N_2O$) gas, a nitrogen dioxide ($NO_2$) gas, a carbon monoxide (CO) gas, a carbon dioxide ($CO_2$) gas, an ozone ($O_3$) gas, a plasma-excited $O_2$ ($O_2^*$) gas, an $H_2$ gas+$O_2$ gas, an $H_2$ gas+$O_3$ gas or the like.

As the inert gas, it may be possible to use, in addition to the $N_2$ gas, a rare gas such as an Ar gas, an He gas, an Ne gas, a Xe gas or the like.

(After Purge and Atmospheric Pressure Return)

After the film having the desired composition and desired thickness is formed on the wafer 200, the valves 243a to 243c are closed to stop the supply of each of the precursor and the reactants into the process chamber 201. Furthermore, the $N_2$ gas as a purge gas is supplied from each of the gas supply pipes 232d to 232f into the process chamber 201 and is exhausted from the exhaust pipe 231. Thus, the interior of the process chamber 201 is purged, and the remaining gas or the reaction byproduct in the process chamber 201, is removed from the interior of the process chamber 201 (after purge). Thereafter, the internal atmosphere of the process chamber 201 is substituted by an inert gas (inert gas substitution). The internal pressure of the process chamber 201 is returned to atmospheric pressure (atmospheric pressure return).

(Boat Unloading and Wafer Discharging)

Thereafter, the seal cap 219 is moved down by the boat elevator 115 to open the lower end of the manifold 209. The processed wafers 200 are unloaded from the lower end of the manifold 209 outside of the reaction tube 203 while being supported by the boat 217 (boat unloading). After the boat unloading, the shutter 219s is moved so that the lower end opening of the manifold 209 is sealed by the shutter 219s through the O-ring 220c (shutter closing). The processed wafers 200 are unloaded outside of the reaction tube 203 and are subsequently discharged from the boat 217 (wafer discharging).

(3) Effects According to the Present Embodiment

According to the present embodiment, one or more effects as set forth below may be achieved.

(a) By setting the flow rate of the $N_2$ gas supplied from the nozzle 249b to become greater than the flow rate of the $N_2$ gas supplied from the nozzle 249a when the HCDS gas is supplied, it is possible to make the in-plane film thickness distribution of the SiOCN film formed on the wafer 200 configured as a bare wafer, be a centrally convex distribution. Thus, when a pattern wafer is used as the wafer 200, an SiOCN film having a flat distribution can be formed on the wafer 200. Moreover, by setting the flow rate of the $N_2$ gas supplied from the nozzle 249b to become greater than the sum of the flow rate of the HCDS gas and the flow rate of the $N_2$ gas which are supplied from the nozzle 249a, it is possible to more reliably realize the aforementioned centrally convex distribution.

It is considered that the in-plane film thickness distribution of the film formed on the wafer 200 depends on a surface area of the wafer 200 due to a so-called loading effect. As the surface area of the wafer 200 on which film is to be formed is increased, a large amount of precursor such as the HCDS gas is consumed in the peripheral portion of the wafer 200, making it difficult to reach its central portion. In this case, the film thickness distribution of the film formed on the wafer 200 becomes a distribution in which the film is thickest in the peripheral portion of the wafer 200 and is gradually reduced in thickness toward the central portion (hereinafter, referred to as a "centrally concave distribution").

According to the present embodiment, even when a pattern wafer having a large surface area is used as the wafer 200, it is possible to freely control the in-plane film thickness distribution of the film formed on the wafer 200 to be corrected from a centrally concave distribution to a flat distribution or further to a centrally convex distribution by balancing the flow rates of the $N_2$ gas supplied from the nozzles 249b and 249a as mentioned above.

(b) By setting the flow rate of the $N_2$ gas supplied from the nozzle 249c to become greater than the flow rate of the $N_2$ gas supplied from the nozzle 249a when the HCDS gas is supplied, it is possible to more reliably realize the aforementioned centrally convex distribution.

(c) By setting the flow rate of the $N_2$ gas supplied from the nozzle 249b to become equal to or greater than the flow rate of the $N_2$ gas supplied from the nozzle 249c, it is possible to realize the aforementioned film thickness distribution control effectively, namely at low consumption of the $N_2$ gas and at low cost. This is because the nozzle 249b is disposed at a position farther from the exhaust port 231a than the nozzle 249c, as described above.

(d) When the control of the in-plane film thickness distribution of the SiOCN film is performed, there is no need to install a new nozzle other than the nozzles 249a to 249c and the existing nozzles 249b and 249c used to supply the TEA gas or the $O_2$ gas may be useful. Thus, it is possible to avoid an increase in the manufacturing cost of the substrate processing apparatus or an increase in the maintenance cost.

(e) The effects mentioned above can be similarly achieved in the case where a precursor gas other than the HCDS gas is used, or in the case where a gas containing C and N other than the TEA gas is used, or in the case where an oxide gas other than the $O_2$ gas is used, or in the case where an inert gas other than the $N_2$ gas is used.

(4) Modifications

The film forming step of the present embodiment may be modified as in modifications described below.

(Modification 1)

Figure 5:
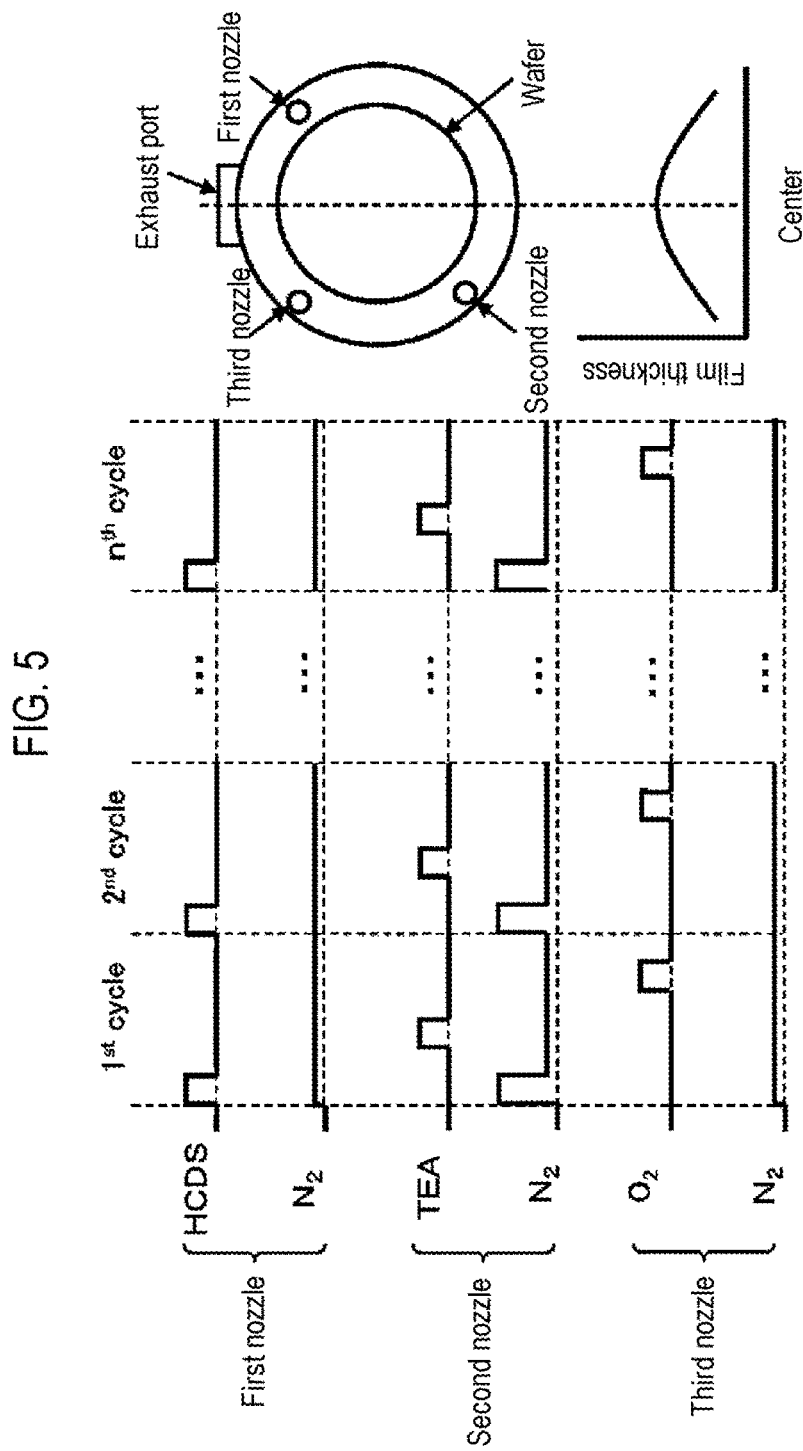
FIG. 5 is a diagram illustrating a first modification of the film forming sequence according to one embodiment of the present disclosure.

As illustrated in FIG. 5, in a state in which the flow rate of the $N_2$ gas supplied from the nozzle 249b is set greater than the flow rate of the $N_2$ gas supplied from the nozzle 249a when the HCDS gas is supplied, the flow rate of the $N_2$ gas supplied from the nozzle 249c may be set to be equal to or less than that of the $N_2$ gas supplied from the nozzle 249a. FIG. 5 illustrates an example in which the flow rate of the $N_2$ gas supplied from the nozzle 249c is equal to that of the $N_2$ gas supplied from the nozzle 249a. In this case, it is possible to control a degree of the centrally convex distribution of the SiOCN film formed on the wafer 200 in a direction to greater alleviate level than in the case of the film forming sequence illustrated in FIG. 4, namely in a direction to make the in-plane film thickness distribution of the SiOCN film closer to a flat distribution from a centrally convex distribution. In a case where a pattern wafer having a relatively small surface area (but having a surface area greater than that of a bare wafer) is used as the wafer 200, it is possible to form the SiOCN film having a flat distribution on the wafer 200 by employing the film forming sequence of this modification. Moreover, in order to suppress the HCDS gas from entering the nozzle 249c, it is desirable that the supply of the $N_2$ gas from the nozzle 249c is performed, for example, under a condition of a flow rate equal to that of the $N_2$ gas supplied from the nozzle 249a, when the HCDS gas is supplied.

(Modification 2)

In a state in which the flow rate of the $N_2$ gas supplied from the nozzle 249c is set greater than the flow rate of the $N_2$ gas supplied from the nozzle 249a when the HCDS gas is supplied, the flow rate of the $N_2$ gas supplied from the nozzle 249b may be set less than that of the $N_2$ gas supplied from the nozzle 249c. In this case, it is possible to control a degree of the centrally convex distribution of the SiOCN film formed on the wafer 200 in a direction to greater alleviate level it than in the case of modification 1, namely in a direction to make the in-plane film thickness distribution of the SiOCN film closer to a flat distribution.

Figure 6:
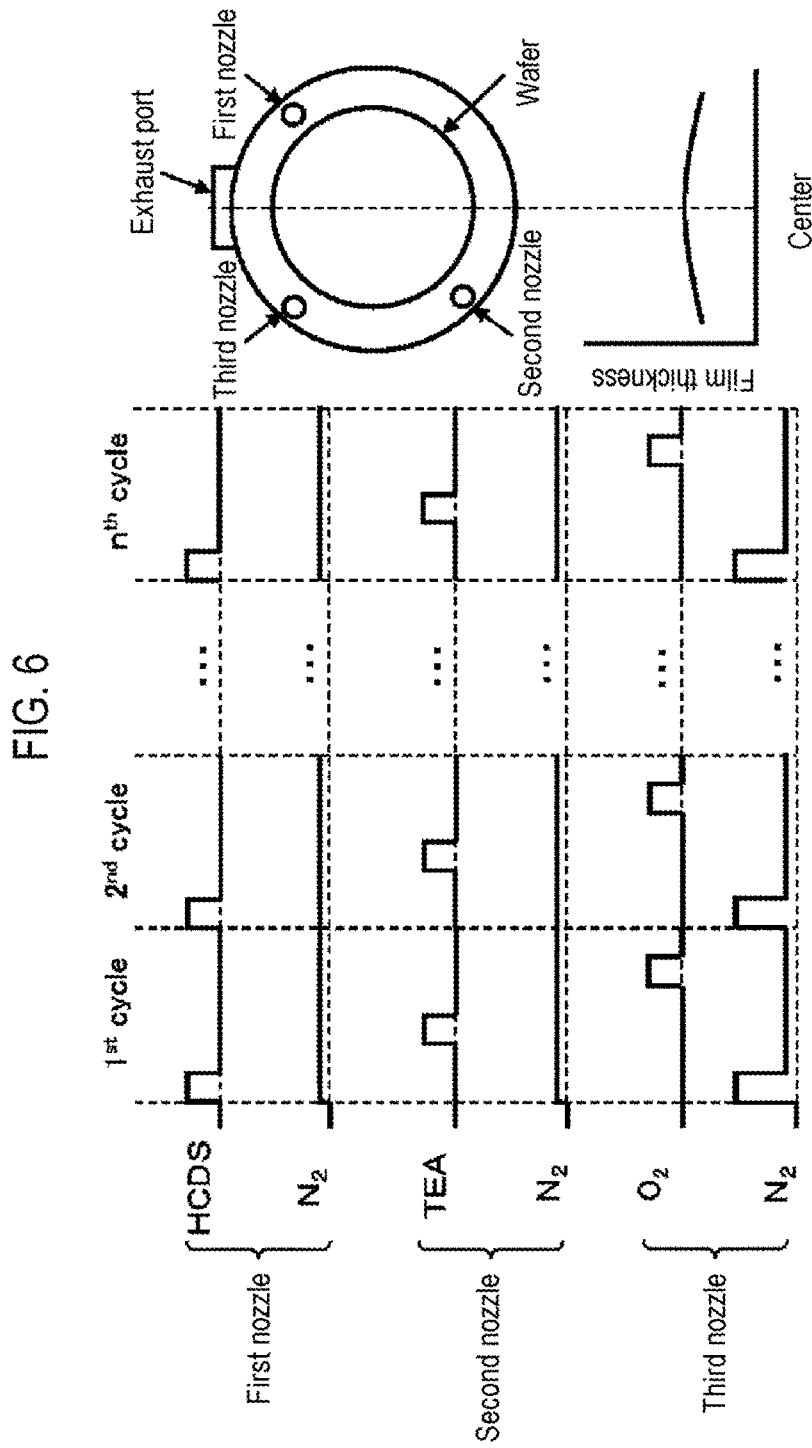
FIG. 6 is a diagram illustrating a second modification of the film forming sequence according to one embodiment of the present disclosure.

In this case, as illustrated in FIG. 6, by setting the flow rate of $N_2$ gas supplied from the nozzle 249b to become equal to or less than the flow rate of the $N_2$ gas supplied from the nozzle 249a, it is possible to control the in-plane film thickness distribution of the SiOCN film to be further closer to the flat distribution. In the case where a pattern wafer having a surface area equal to or slightly greater than that of a bare wafer) is used as the wafer 200, it is possible to form the SiOCN film having a flat distribution on the wafer 200 by employing the film forming sequence of this modification. Moreover, in order to suppress the HCDS gas from entering the nozzle 249b, it is desirable that the supply of the $N_2$ gas from the nozzle 249b is performed, for example, under a condition of a flow rate equal to that of the $N_2$ gas supplied from the nozzle 249a, when the HCDS gas is supplied.

Furthermore, in this modification, by setting the flow rate of the $N_2$ gas supplied from the nozzle 249c to become greater than the sum of the flow rate of the HCDS gas and the flow rate of the $N_2$ gas which are supplied from the nozzle 249a when the HCDS gas is supplied, it is possible to more reliably control the in-plane film thickness distribution of the SiOCN film to become a flat distribution rather than a centrally concave distribution.

In the case where the flow rate balance of the $N_2$ gas is set as in this modification, the flow rate of the $N_2$ gas supplied from the nozzle 249c when HCDS is supplied becomes greater than the flow rate of the $N_2$ gas supplied from the nozzle 249c when HCDS is not supplied. For example, the flow rate of the $N_2$ gas supplied from the nozzle 249c when HCDS is supplied becomes greater than the flow rate of the $N_2$ gas supplied from the nozzle 249c when the TEA gas is supplied at step 2, and also greater than the flow rate of the $N_2$ gas supplied from the nozzle 249c when the $O_2$ gas is supplied at step 3. In addition, in the case where the flow rate balance of the $N_2$ gas is set as described above, the flow rate of the $N_2$ gas supplied from the nozzle 249c when HCDS is supplied becomes greater than the flow rate of the $N_2$ gas supplied from the nozzle 249c when the interior of the process chamber 201 is purged.

(Modification 3)

Figure 7:
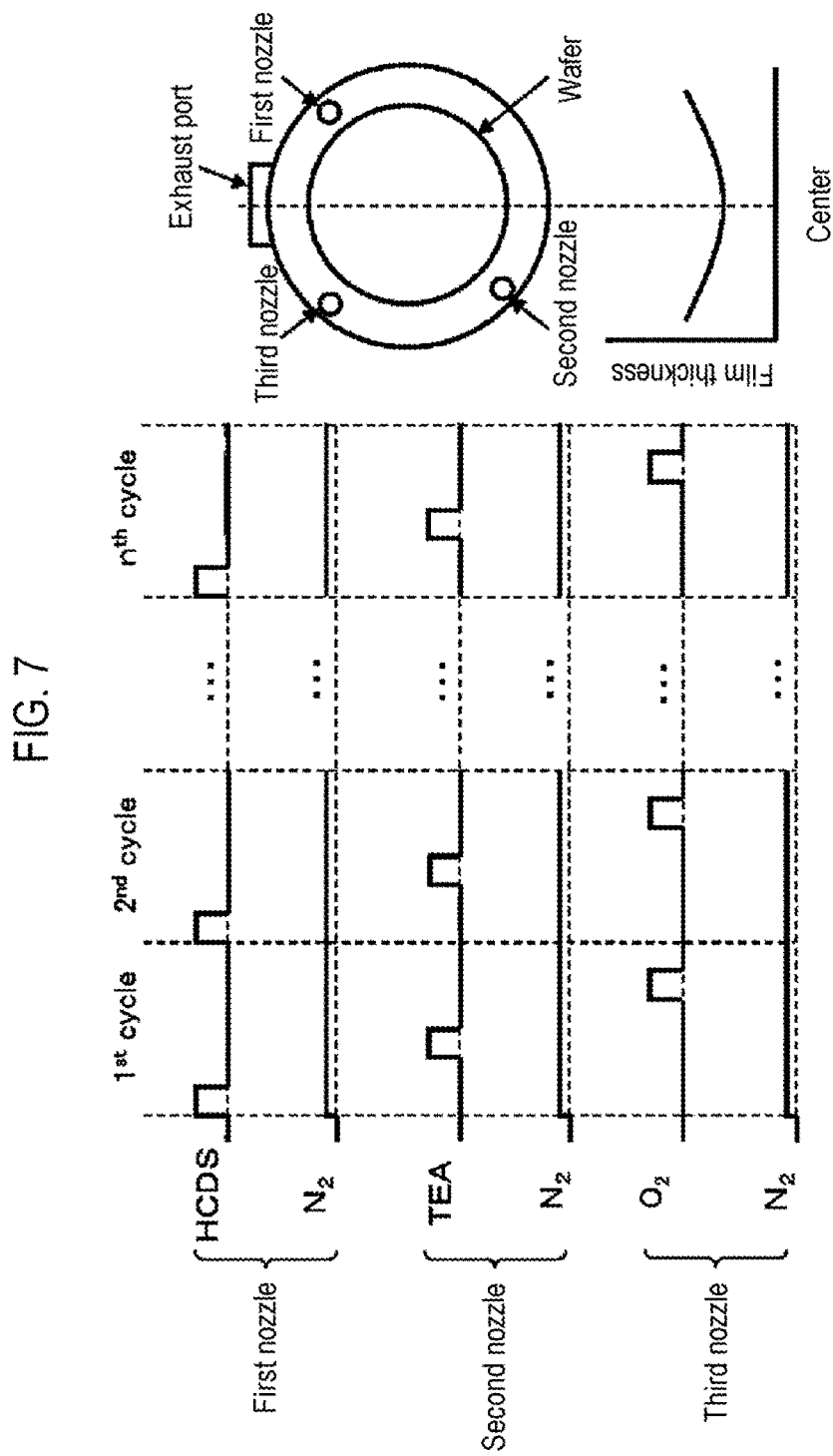
FIG. 7 is a diagram illustrating a third modification of the film forming sequence according to one embodiment of the present disclosure.

As illustrated in FIG. 7, the flow rate of the $N_2$ gas supplied from each of the nozzle 249b and the nozzle 249c may be set equal to the flow rate of the $N_2$ gas supplied from the nozzle 249a when the HCDS gas is supplied. In this case, it is possible to make the film thickness distribution of the SiOCN film formed on the wafer 200 closer to a centrally concave distribution from a flat distribution.

(Modification 4)

As the precursor, it may be possible to use, for example, an alkylhalosilane precursor gas such as a 1,1,2,2-tetra-chloro-1,2-dimethyldisilane $((CH_3)_2Si_2Cl_4$, abbreviation: TCDMDS) gas or an aminosilane precursor gas such as a tris-dimethylaminosilane $(Si[N(CH_3)_2]_3H$, abbreviation: 3DMAS) gas or a bis(diethylamino)silane $(SiH_2[N(C_2H_5)_2]_2$, abbreviation: BDEAS) gas. Also, as the precursor, it may be possible to use a silane precursor gas such as a monosilane $(SiH_4)$ gas or a disilane $(Si_2H_6)$ gas.

Furthermore, as the reactant, it may be possible to use, for example, a C-containing gas such as a propylene $(C_3H_6)$ gas or an N-containing gas (nitriding agent) such as an ammonia $(NH_3)$ gas. In addition, as the oxidizing agent, it may be possible to use an $O_3$ gas or an $O_2^*$ gas.

Then, an SiOCN film, an SiOC film, a silicon oxynitride film (SiON film), a silicon carbonitride film (SiCN film), a silicon nitride film (SiN film), or a silicon oxide film (SiO film) may be formed on the wafer 200 by, for example, film forming sequences illustrated below.

(HCDS→TEA→$O_2$)×n⇒SiOC(N)

(HCDS→$C_3H_6$→$O_2$→$NH_3$)×n⇒SiOCN (HCDS→$C_3H_6$→$NH_3$→$O_2$)×n⇒SiOCN ($C_3H_6$→HCDS→$C_3H_6$→$O_2$→$NH_3$)×n⇒SiOCN ($C_3$→$H_6$→HCDS→$C_3H_6$→$NH_3$→$O_2$)×n⇒SiOCN (TCDMDS→$NH_3$→$O_2$)×n⇒SiOCN (HCDS→$NH_3$→$O_2$)×n⇒SiON (HCDS→$C_3H_6$→$NH_3$)×n⇒SiCN (TCDMDS→$NH_3$)×n⇒SiCN (HCDS→TEA)×n⇒SiCN (HCDS→$NH_3$)×n⇒SiN (3DMAS→$O_3$)×n⇒SiO (BDEAS→$O_2^*$)×n⇒SiO

Even in these film forming sequences, by controlling the balance of the flow rates of the $N_2$ gas supplied from the nozzles 249a to 249c in the same manner as the film forming sequence illustrated in FIG. 4 and modifications 1 to 3 when the precursor is supplied, the same effects as those of the film forming sequence illustrated in FIG. 4 and the modifications may be achieved. Furthermore, the $C_3H_6$ gas may be supplied from, for example, the nozzle 249a, and the $NH_3$ gas may be supplied from, for example, the nozzle 249b. The process procedures and process conditions used when the precursor or the reactant is supplied may be similar to those of the film forming sequence illustrated in FIG. 4 and modifications 1 to 3.

Other Embodiments of the Present Disclosure

While one embodiment of the present disclosure has been specifically described above, the present disclosure is not limited to the aforementioned embodiment but may be differently modified without departing from the spirit of the present disclosure.

In the aforementioned embodiment, there has been described an example in which the HCDS gas, the TEA gas, and the $O_2$ gas are supplied from the nozzles 249a to 249c, respectively, but the present disclosure is not limited to the aforementioned embodiment. For example, from the nozzles 249a to 249c, the HCDS gas, the $O_2$ gas, and the TEA gas may be respectively supplied, the TEA gas, the $O_2$ gas, the HCDS gas may be respectively supplied, or the $O_2$ gas, the TEA gas and the HCDS gas may be respectively supplied. Even in these cases, by controlling the balance of the flow rates of the $N_2$ gas supplied from the nozzles 249a to 249c in the same manner as the film forming sequence illustrated in FIG. 4 and modifications 1 to 3 when the HCDS gas is supplied, the same effects as those of the film forming sequence illustrated in FIG. 4 and modifications 1 to 3 may be achieved.

In the aforementioned embodiment, there has been described an example in which the balance of the flow rates of the $N_2$ gas supplied from the nozzles 249a to 249c is controlled when the HCDS gas is supplied, but the present disclosure is not limited to the aforementioned embodiment. For example, the balance of the flow rate of the $N_2$ gas as described above may be controlled, not when the HCDS gas is supplied but when the TEA gas is supplied. In this case, it is possible to control the distribution of N concentration or the distribution of C concentration in the plane of the wafer 200, in the film formed on the wafer 200. Furthermore, for example, the balance of the flow rate of the $N_2$ gas as described above may be controlled when the $O_2$ gas is supplied. In this case, it is possible to control the distribution of $O_2$ concentration in the plane of the wafer 200, in the film formed on the wafer 200. The balance of the flow rate of the $N_2$ gas when the TEA gas is supplied or when the $O_2$ gas is supplied may be controlled under the same process conditions and process procedures as those of the film forming sequence illustrated in FIG. 4 and modifications 1 to 3.

In the aforementioned embodiment, there has been described an example in which a film containing Si as a major element is formed on the substrate, but the present disclosure is not limited to the aforementioned embodiment. That is to say, the present disclosure may be suitably applied to a case where a film containing a semimetal element such as germanium (Ge), boron (B) or the like as a major element, in addition to Si, is formed on the substrate. Moreover, the present disclosure may be suitably applied to a case where a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like as a main element is formed on the substrate.

For example, the present disclosure may be suitable where a titanium oxycarbonitride film (TiOCN film), a titanium oxycarbide film (TiOC film), a titanium oxynitride film (TiON film), a titanium aluminum carbonitride film (TiAlCN film), a titanium aluminum carbide film (TiAlC film), a titanium nitride film (TiN film), or a titanium oxide film (TiO film) is formed on the substrate using a titanium tetrachloride (TiCl$_4$) gas or a trimethylaluminum (Al(CH$_3$)$_3$, abbreviation: TMA) gas as the precursor according to film forming sequences illustrated below.

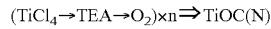

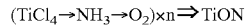

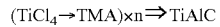

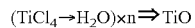

Recipes used in the substrate process may be prepared individually according to the process contents and may be stored in the memory device 121c, via a telecommunication line or the external memory device 123. Moreover, at the start of the substrate process, the CPU 121a, may properly select an appropriate recipe from the recipes stored in the memory device 121c, according to the contents of the substrate process. Thus, it is possible for a single substrate processing apparatus to form films of different kinds, composition ratios, qualities and thicknesses with enhanced reproducibility. In addition, it is possible to reduce an operator's burden and to quickly start the substrate process while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace.

In the case of using these substrate processing apparatuses, a film forming process may be performed by process procedures and process conditions similar to those of the embodiment and modifications described above. Effects similar to those of the embodiment and modifications described above may be achieved.

The embodiment and modifications described above may be appropriately combined with one another. In addition, the process procedures and process conditions used at this time may be similar to, for example, the process procedures and process conditions of the embodiment described above.

Since the SiOCN film or the like formed by the method of the embodiment and modifications described above has both low dielectric constant and high etching resistance, it may be widely used as an insulating film, a spacer film, a mask film, an electric charge film, a stress control film or the like, instead of the conventional SiO film or SiN film. Recently, the requirement for the in-plane film thickness uniformity of films formed on a wafer is becoming more severe with the miniaturization of semiconductor devices. It is considered that the present disclosure, which teaches forming a film having a flat distribution on a pattern wafer on which a high density pattern is formed on its surface, will be very useful as a technology which meets such requirement.

EXAMPLES

Next, experimental results supporting the effects achieved from the aforementioned embodiment will be described.

Example 1

Samples 1 to 3 in which an SiOCN film is formed on a wafer by a film forming sequence in which a cycle which non-simultaneously supplies an HCDS gas, a TEA gas, and an O$_2$ gas to the wafer in this order is performed a predetermined number of times using the substrate processing apparatus illustrated in FIG. 1 were prepared. A bare wafer on which an irregular structure is not formed on its surface was used as the wafer. When preparing sample 1, the supply flow rate of the N$_2$ gas from each of the second and third nozzles when the HCDS gas is supplied was set at a flow rate which falls within a range of 2,500 to 3,500 sccm. When preparing sample 2, the supply flow rate of N$_2$ gas from each of the second and third nozzles when the HCDS gas is supplied was set at a flow rate which falls within a range of 1,000 to 2,000 sccm. When preparing sample 3, the supply flow rate of N$_2$ gas from each of the second and third nozzles when the HCDS gas is supplied was set at a flow rate which falls within a range of 400 to 600 sccm. In either case, the supply flow rate of the N$_2$ gas from the first nozzle when the HCDS gas is supplied was set at a flow rate which falls within a range of 400 to 600 sccm. Other process conditions were similar to those of the aforementioned embodiment.

Figure 8:
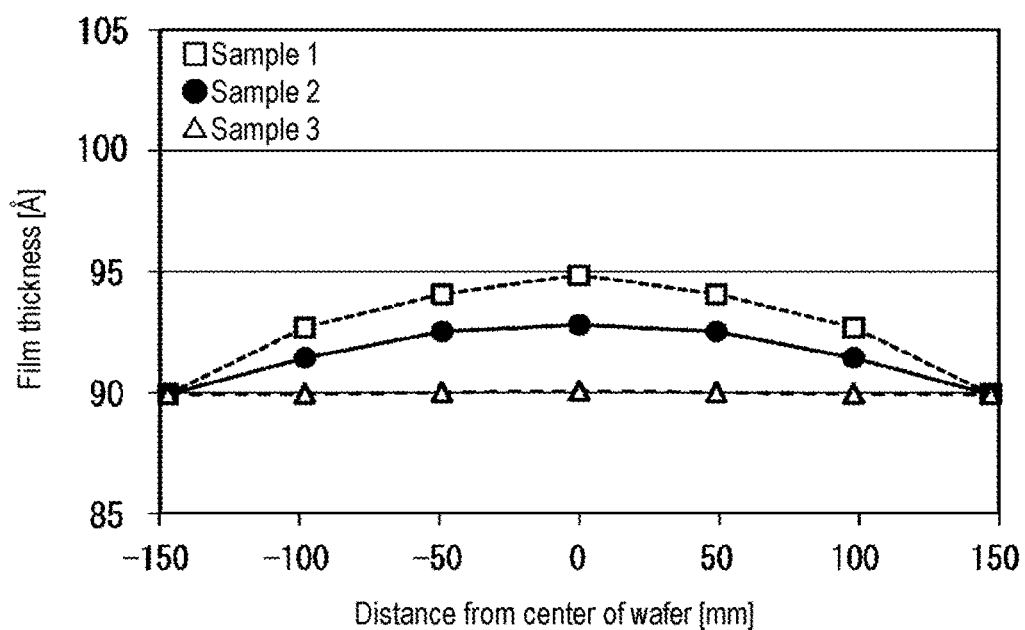
FIG. 8 is a diagram illustrating an evaluation result of a substrate in-plane film thickness distribution of a film formed on a substrate.

Then, an in-plane film thickness distribution of the SiOCN film in each of samples 1 to 3 was measured. FIG. 8 shows the measurement results. In FIG. 8, the vertical axis represents a film thickness [Å], and the horizontal axis represents a distance [mm] from the center of the wafer at a measurement position. The horizontal axis of 0 [mm] means the center of the wafer. In FIG. 8, the marks □, •, and Δ indicate evaluation results of samples 1 to 3, respectively. According to FIG. 8, it can be seen that as the supply flow rate of the N$_2$ gas from the second and third nozzles when the HCDS gas is supplied is increased, the in-plane film thickness distribution of the SiOCN film become closer to a centrally convex distribution from a flat distribution, and the degree becomes larger.

Example 2

Samples 4 to 6 in which an SiOCN film is formed on a wafer by a film forming sequence in which a cycle which non-simultaneously supplies an HCDS gas, a $C_3H_6$ gas, an $NH_3$ gas, and an $O_2$ gas to the wafer in this order is performed a predetermined number of times using the substrate processing apparatus illustrated in FIG. 1 were prepared. A bare wafer on which an irregular structure is not formed on its surface was used as the wafer. When preparing sample 4, the supply flow rate of the $N_2$ gas from the second nozzle when the HCDS gas is supplied was set at a flow rate which falls within a range of 5,000 to 7,000 sccm, and the supply flow rate of the $N_2$ gas from the third nozzle when the HCDS gas is supplied was set at a flow rate which falls within a range of 400 to 600 sccm. When preparing sample 5, the supply flow rate of the $N_2$ gas from the second nozzle when the HCDS gas is supplied was set at a flow rate which falls within a range of 400 to 600 sccm, and the supply flow rate of the $N_2$ gas from the third nozzle when the HCDS gas is supplied was set at a flow rate which falls within a range of 5,000 to 7,000 sccm. When preparing sample 6, the supply flow rate of the $N_2$ gas from each of the second and third nozzles when the HCDS gas is supplied was set at a flow rate which falls within a range of 400 to 600 sccm. In either case, the supply flow rate of the $N_2$ gas from the first nozzle when the HCDS gas is supplied was set at a flow rate which falls within a range of 400 to 600 sccm. Other process conditions were similar to those of the aforementioned embodiment.

Figure 9A:
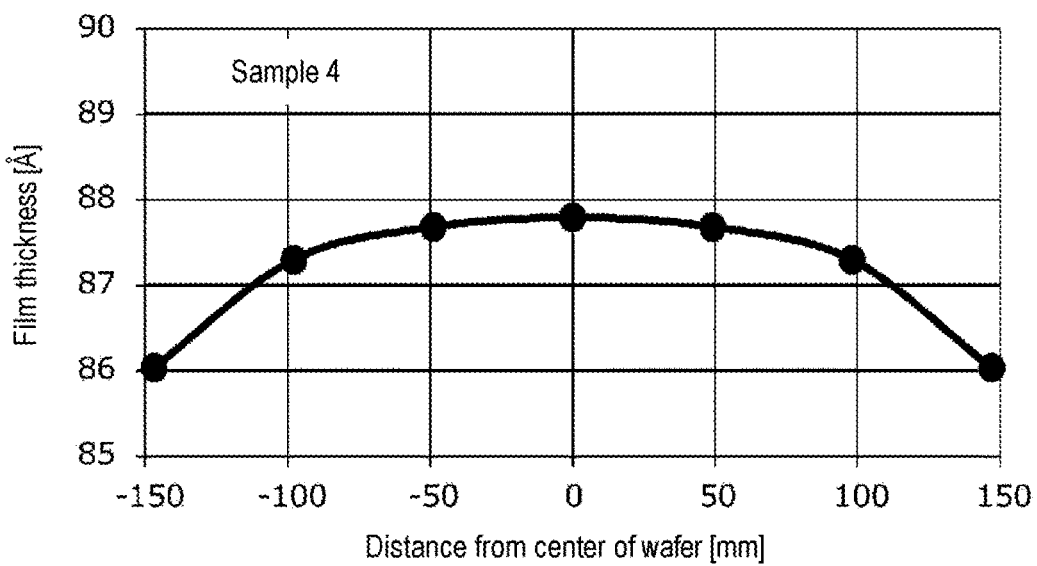
FIGS. 9A to 9C are diagrams illustrating evaluation results of a substrate in-plane film thickness distribution of a film formed on a substrate, respectively.
Figure 9B:
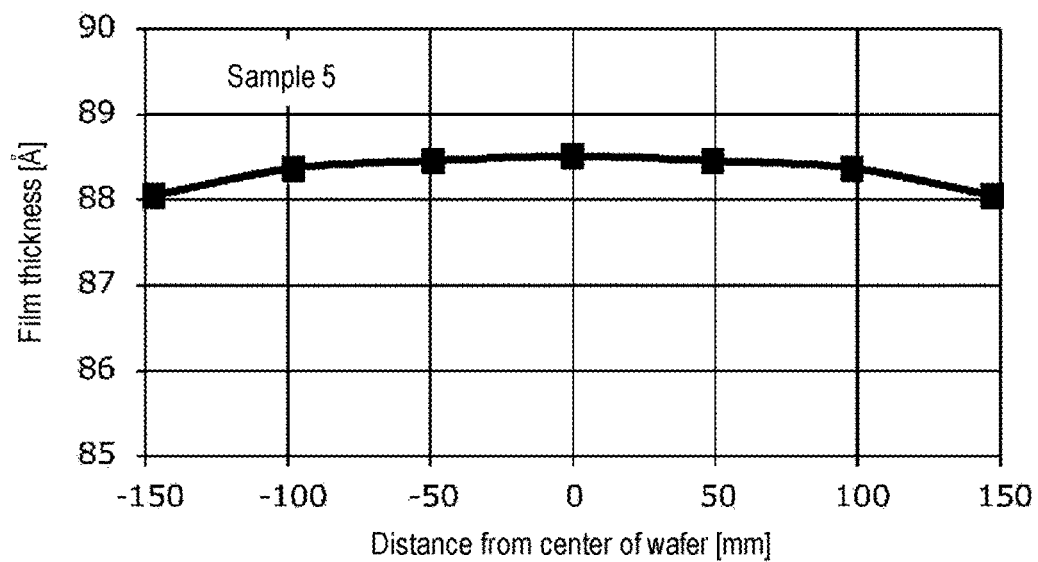
Figure 9C:
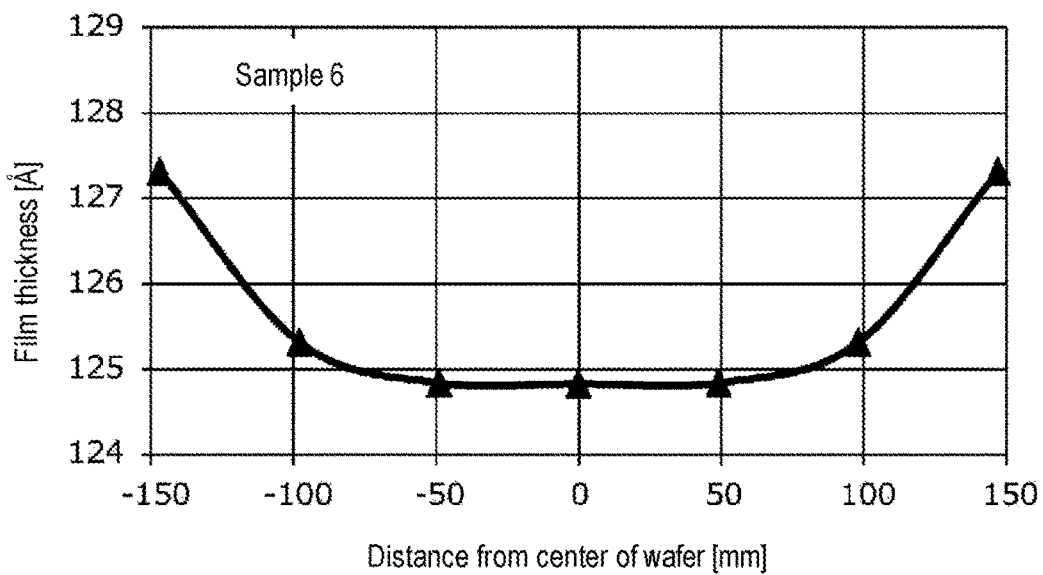

Then, an in-plane film thickness distribution of the SiOCN film in each of samples 4 to 6 was measured. FIGS. 9A to 9C show the measurement results of samples 4 to 6, respectively. In FIGS. 9A to 9C, the vertical axis represents a film thickness [Å], and the horizontal axis represents a distance [mm] from the center of the wafer at a measurement position.

According to FIG. 9A, it can be seen that, in sample 4 prepared by setting the flow rate of the $N_2$ gas supplied from the second nozzle to become greater than the flow rate of the $N_2$ gas supplied from the first nozzle when the HCDS gas is supplied, and the flow rate of the $N_2$ gas supplied from the third nozzle to become equal to the flow rate of the $N_2$ gas supplied from the first nozzle, the in-plane film thickness distribution of the SiOCN film becomes a centrally convex distribution.

According to FIG. 9B, it can be seen that, in sample 5 prepared by setting the flow rate of the $N_2$ gas supplied from the second nozzle to become equal to the flow rate of the $N_2$ gas supplied from the first nozzle when the HCDS gas is supplied, and the flow rate of the $N_2$ gas supplied from the third nozzle to become greater than the flow rate of the $N_2$ gas supplied from the first nozzle, the in-plane film thickness distribution of the SiOCN film becomes a flat distribution.

According to FIG. 9C, it can be seen that, in sample 6 prepared by setting the flow rate of the $N_2$ gas supplied from each of the second and third nozzles to become equal to the flow rate of the $N_2$ gas supplied from the first nozzle when the HCDS gas is supplied, the in-plane film thickness distribution of the SiOCN film becomes a centrally concave distribution.

According to the present disclosure in some embodiments, it is possible to control a substrate in-plane film thickness distribution of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a film on a substrate by performing a cycle a predetermined number of times, the cycle including non-simultaneously performing:
      supplying a precursor from a first nozzle to a substrate and exhausting the precursor from an exhaust port;
      supplying a first reactant from a second nozzle disposed at a position farther from the exhaust port than the first nozzle to the substrate and exhausting the first reactant from the exhaust port; and
      supplying a second reactant from a third nozzle disposed at a position closer to the exhaust port than the second nozzle to the substrate and exhausting the second reactant from the exhaust port,
   wherein a substrate in-plane film thickness distribution of the film formed on the substrate is controlled by, in an act of supplying the precursor, controlling a balance between a flow rate of an inert gas supplied from the second nozzle, a flow rate of an inert gas supplied from the third nozzle, and a flow rate of an inert gas supplied from the first nozzle.

2. The method of claim 1, wherein, in the act of supplying the precursor, the flow rate of the inert gas supplied from the second nozzle is set greater than the flow rate of the inert gas supplied from the first nozzle.

3. The method of claim 2, wherein, in the act of supplying the precursor, the flow rate of the inert gas supplied from the second nozzle is set greater than a sum of the flow rate of the precursor and the flow rate of the inert gas which are supplied from the first nozzle.

4. The method of claim 2, wherein, in the act of supplying the precursor, the flow rate of the inert gas supplied from the third nozzle is set greater than the flow rate of the inert gas supplied from the first nozzle.

5. The method of claim 4, wherein, in the act of supplying the precursor, the flow rate of the inert gas supplied from the second nozzle is set equal to or greater than the flow rate of the inert gas supplied from the third nozzle.

6. The method of claim 4, wherein, in the act of supplying the precursor, the flow rate of the inert gas supplied from the second nozzle is set greater than the flow rate of the inert gas supplied from the third nozzle.

7. The method of claim 2, wherein, in the act of supplying the precursor, the flow rate of the inert gas supplied from the third nozzle is set equal to or less than the flow rate of the inert gas supplied from the first nozzle.

8. The method of claim 2, wherein, in the act of supplying the precursor, the flow rate of the inert gas supplied from the third nozzle is set equal to the flow rate of the inert gas supplied from the first nozzle.

9. The method of claim 1, wherein, in the act of supplying the precursor, the flow rate of the inert gas supplied from the second nozzle is set less than the flow rate of the inert gas supplied from the third nozzle, and the flow rate of the inert gas supplied from the third nozzle is set greater than the flow rate of the inert gas supplied from the first nozzle.

10. The method of claim 9, wherein, in the act of supplying the precursor, the flow rate of the inert gas supplied from the third nozzle is set greater than a sum of the flow rate of the precursor and the flow rate of the inert gas which are supplied from the first nozzle.

11. The method of claim 9, wherein, in the act of supplying the precursor, the flow rate of the inert gas supplied from the second nozzle is set equal to the flow rate of the inert gas supplied from the first nozzle.

12. The method of claim 1, wherein, in the act of supplying the precursor, the flow rate of the inert gas supplied from each of the second nozzle and the third nozzle is set equal to the flow rate of the inert gas supplied from the first nozzle.

13. The method of claim 1, wherein the precursor includes halosilane.

14. A substrate processing apparatus, comprising:
a process chamber in which a substrate is processed;
an exhaust system configured to exhaust an interior of the process chamber from an exhaust port;
a precursor supply system configured to supply a precursor from a first nozzle into the process chamber;
a first reactant supply system configured to supply a first reactant from a second nozzle disposed at a position farther from the exhaust port than the first nozzle into the process chamber;
a second reactant supply system configured to supply a second reactant from a third nozzle disposed at a position closer to the exhaust port than the second nozzle into the process chamber;
an inert gas supply system configured to supply an inert gas from the first nozzle, the second nozzle and the third nozzle into the process chamber; and
a controller configured to control the precursor supply system, the first reactant supply system, the second reactant supply system, the inert gas supply system and the exhaust system to perform, inside the process chamber:

forming a film on the substrate by performing a cycle a predetermined number of times, the cycle including non-simultaneously performing:
supplying the precursor from the first nozzle to the substrate and exhausting the precursor from the exhaust port;
supplying the first reactant from the second nozzle to the substrate and exhausting the first reactant from the exhaust port; and
supplying the second reactant from the third nozzle to the substrate and exhausting the second reactant from the exhaust port,
wherein a substrate in-plane film thickness distribution of the film formed on the substrate is controlled by, in an act of supplying the precursor, controlling a balance between a flow rate of the inert gas supplied from the second nozzle, a flow rate of the inert gas supplied from the third nozzle, and a flow rate of the inert gas supplied from the first nozzle.

15. A non-transitory computer-readable recording medium storing a program that causes a computer to control a substrate processing apparatus to perform a process in a process chamber of the substrate processing apparatus, the process comprising:
forming a film on a substrate by performing a cycle a predetermined number of times, the cycle including non-simultaneously performing:
supplying a precursor from a first nozzle to a substrate and exhausting the precursor from an exhaust port;
supplying a first reactant from a second nozzle disposed at a position farther from the exhaust port than the first nozzle to the substrate and exhausting the first reactant from the exhaust port; and
supplying a second reactant from a third nozzle disposed at a position closer to the exhaust port than the second nozzle to the substrate and exhausting the second reactant from the exhaust port; and
controlling a substrate in-plane film thickness distribution of the film formed on the substrate by, in an act of supplying the precursor, controlling a balance between a flow rate of an inert gas supplied from the second nozzle, a flow rate of an inert gas supplied from the third nozzle, and a flow rate of an inert gas supplied from the first nozzle.

* * * * *